United States Patent
Pedretti et al.

(10) Patent No.: US 12,387,788 B2
(45) Date of Patent: Aug. 12, 2025

(54) COMPRESSION OF ANALOG CONTENT ADDRESSABLE MEMORY

(71) Applicant: Hewlett Packard Enterprise Development LP, Spring, TX (US)

(72) Inventors: Giacomo Pedretti, Verbania (IT); Catherine Graves, Milpitas, CA (US); John Paul Strachan, San Carlos, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 219 days.

(21) Appl. No.: 18/469,457

(22) Filed: Sep. 18, 2023

(65) Prior Publication Data

US 2025/0095736 A1    Mar. 20, 2025

(51) Int. Cl.
*G11C 15/04*    (2006.01)

(52) U.S. Cl.
CPC .................. *G11C 15/046* (2013.01)

(58) Field of Classification Search
CPC .................................................. G11C 15/046
USPC ....................................................... 365/49.17
See application file for complete search history.

(56) References Cited

U.S. PATENT DOCUMENTS

| | | | |
|---|---|---|---|
| 7,206,212 B1 | 4/2007 | Chou | |
| 8,705,568 B2 | 4/2014 | Kropp | |
| 10,146,991 B2 | 12/2018 | Sapiro et al. | |
| 10,998,047 B1 | 5/2021 | Li et al. | |
| 11,967,378 B2 * | 4/2024 | Tseng | G11C 15/04 |
| 2013/0246698 A1 | 9/2013 | Estan et al. | |
| 2018/0139153 A1 | 5/2018 | Moradi et al. | |
| 2019/0106732 A1 | 4/2019 | Spurlock, III | |
| 2019/0316909 A1 | 10/2019 | White et al. | |
| 2020/0293906 A1 | 9/2020 | Xu et al. | |
| 2020/0387452 A1 | 12/2020 | Vasyltsov et al. | |
| 2021/0004726 A1 | 1/2021 | Shang et al. | |
| 2021/0118545 A1 | 4/2021 | Sathyanarayana et al. | |
| 2021/0327508 A1 * | 10/2021 | Li | G11C 15/04 |
| 2025/0054547 A1 * | 2/2025 | Pedretti | G11C 15/046 |

FOREIGN PATENT DOCUMENTS

WO    2021042081 A1    3/2021

OTHER PUBLICATIONS

Kazemi, et al., "In-Memory Nearest Neighbor Search with FeFET Multi-Bit Content-Addressable Memories," IEEE, Published in: 2021 Design, Automation & Test in Europe Conference & Exhibition, DOI: 10.23919/DATE51398.2021.9474025, Feb. 2021, 6 pages.

(Continued)

*Primary Examiner* — Connie C Yoha
(74) *Attorney, Agent, or Firm* — Slater Matsil, LLP

(57) ABSTRACT

A technique for compressing an analog content addressable memory (CAM) array is provided. Random input data is applied to the analog CAM array, and an average measure of similarity is calculated for each output row of the analog CAM array. Rows of the analog CAM array that have measures of similarity that are close to each other can be eliminated, such as by removing similar rows or merging together similar rows. Thus, the analog CAM array size can be reduced without a loss in accuracy of a model stored on the analog CAM array.

20 Claims, 9 Drawing Sheets

(56) References Cited

OTHER PUBLICATIONS

Kazemi et al., "A Flash-Based Multi-Bit Content-Addressable Memory with Euclidean Squared Distance," IEEE, published in: 2021 IEEE/ACM International Symposium on Low Power Electronics and Design (ISLPED), Jul. 2021, doi: 10.1109/ISLPED52811.2021.9502488, 6 pages.

Li, et al., "Critical non-Hermitian skin effect," Nature Communications, 11, Oct. 2020, 8 pages.

* cited by examiner

COMPRESSION OF ANALOG CONTENT ADDRESSABLE MEMORY

BACKGROUND

Content addressable memory (CAM) is a type of computing memory in which the stored data is not accessed by its location, but rather by its content. An analog CAM can search multi-level voltages and store analog ranges in a nonvolatile memory. A range of voltages (e.g., variance range) defined by an upper limit and a lower limit can be programmed for each analog CAM cell of the analog CAM. A word, or "tag", is input into the analog CAM, and the analog CAM searches for the tag in its contents, and when a value of the input data is matched by the stored range of voltage values, the analog CAM returns the address of the location where the found contents reside. CAMs are powerful, efficient, and fast. However, CAMs are also relatively large, consume a lot of power, and are relatively expensive. These drawbacks limit their applicability to select applications in which their power, efficiency, and speed are sufficiently desirable to outweigh their size, cost, and power consumption.

BRIEF DESCRIPTION OF THE DRAWINGS

Aspects of the present disclosure are best understood from the following detailed description when read with the accompanying figures.

Corresponding numerals and symbols in the different figures generally refer to corresponding parts unless otherwise indicated. The figures are drawn to clearly illustrate the relevant aspects of the disclosure and are not necessarily drawn to scale.

DETAILED DESCRIPTION

Figure 1:
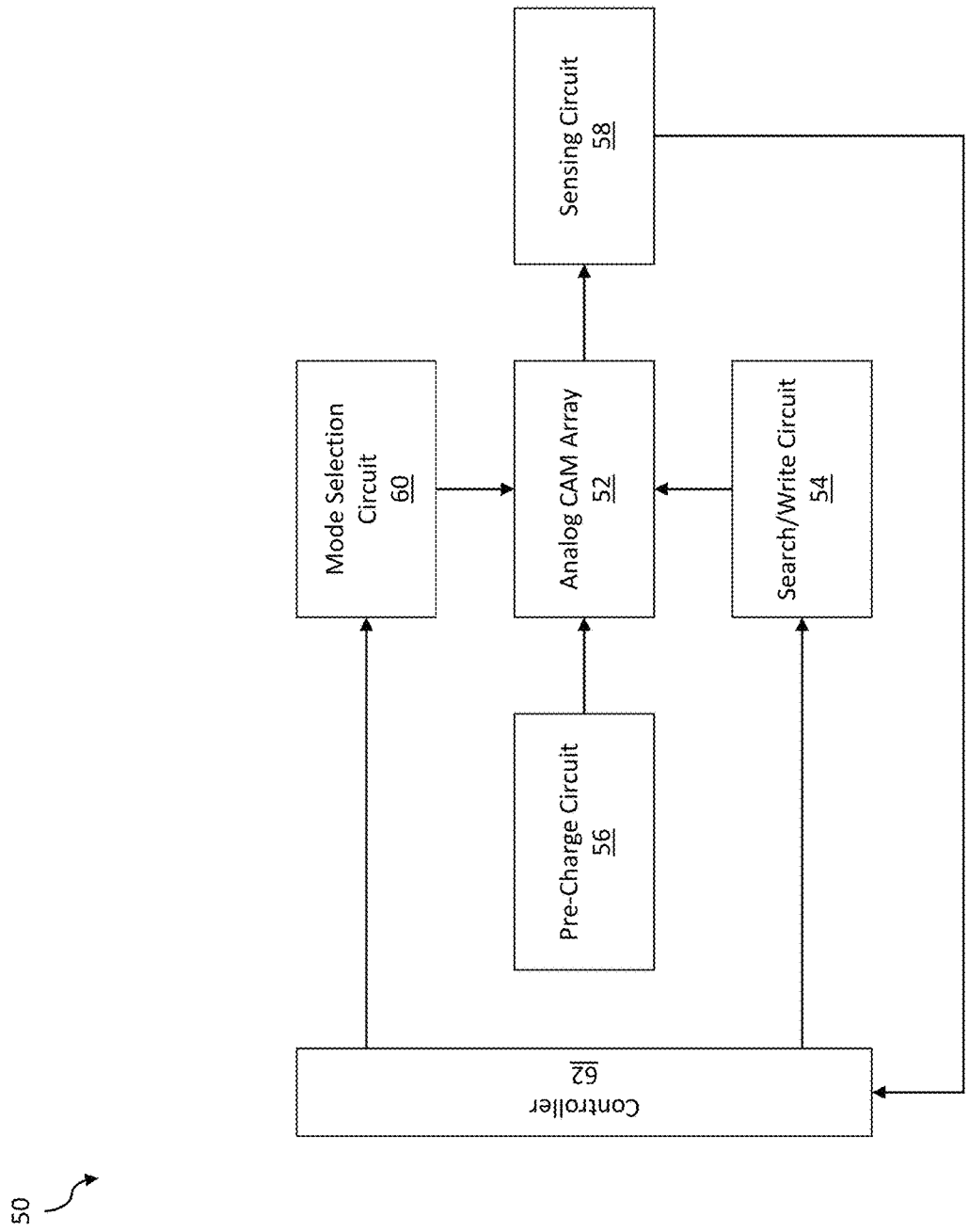
FIG. 1 is a block diagram of content addressable memory system, according to some implementations.

The following disclosure provides many different examples for implementing different features. Specific examples of components and arrangements are described below to simplify the present disclosure. These are, of course, merely examples and are not intended to be limiting.

Various implementations described herein are directed to compression of an analog content addressable memory (CAM) array, which implements an analog representation of a sparse look-up table (LUT). The sparse LUT may be generated by any acceptable technique. For example, the sparse LUT may be based on a machine learning model (e.g., such as a decision tree model). The analog CAM array includes a plurality of analog CAM cells arranged in rows and columns. The overall utilization of the analog CAM array may not be optimal as some rows of the CAM cells in the analog CAM array may be populated by redundant data, or not populated at all. It therefore becomes advantageous to identify rows that are similar, and perform a compression method to eliminate similar rows, such as by merging these similar rows, or even removing some of the similar rows entirely.

A method of compressing the analog CAM array includes applying random input data to each row of the analog CAM array, and calculating an average measure of similarity for the output of each row of the analog CAM array. The measure of similarity for each row of analog CAM cells is measured by sensing a discharge current flowing through pull-down transistors of the CAM cells and into a discharge line of the row. The discharge line of the CAM cells of each row is connected to a transimpedance amplifier (TIA) and an analog-to-digital converter (ADC). The TIA produces an analog output of each row, which can be sensed and converted to a digital representation by the ADC. This digital representation is the measure of similarity of a row of the analog CAM array to the applied input. The average measure of similarity of the row of the analog CAM array is then calculated over the number of elements of the random input data, and this average measure of similarity is then compared to other digital representations of the calculated average measures of similarity of other rows. Rows of the analog CAM array that have average measures of similarity that are close to each other (within a desired amount) can then be compressed by merging them together and/or removing one of them. Advantageous features of one or more implementations disclosed herein may allow for the size of the analog CAM array to be reduced by up to 15 percent without an appreciable loss in model inference accuracy, in the case of using an analog CAM as a decision tree inference accelerator. This allows for a reduction in the number of analog CAM rows that need to be programmed, which results in time savings. In addition, a reduction in occupation area or memory size can be achieved. This results in lower power consumption since smaller memory arrays require fewer active components and consume less energy during search and write operations. Further, the use of compression allows a larger model to be converted into an analog representation using the analog CAM array, since the model is not limited to only a size that a physical array can encode.

FIG. 1 is a block diagram of content addressable memory device 50, according to some implementations. The content addressable memory device 50 includes an analog CAM array 52 as well as multiple peripheral circuits used for programming and operating the analog CAM array 52. The peripheral circuits include a search/write circuit 54, a precharge circuit 56, a sensing circuit 58, a mode selection circuit 60, and a controller 62. As alluded to above, the analog CAM array 52 can search multi-level voltages and stores analog values in a nonvolatile memory, such as memristors (or programmable resistors). A range of voltages (e.g., variance range) can be programmed for each analog CAM cell of the analog CAM array 52, which can be implemented using a circuit (subsequently described) that comprises, for example, multiple memristors.

In general, CAMs can be implemented in technologies that permit the CAM to store its contents, even when power is lost or otherwise removed. Thus, a CAM's data persists such that a CAM can act as a non-volatile memory. These technologies include, for instance, resistive switching memory (i.e., memristor), phase change memory, magnetoresistive memory, ferroelectric memory, some other resistive random access memory device, or combinations of those technologies.

Figure 2:
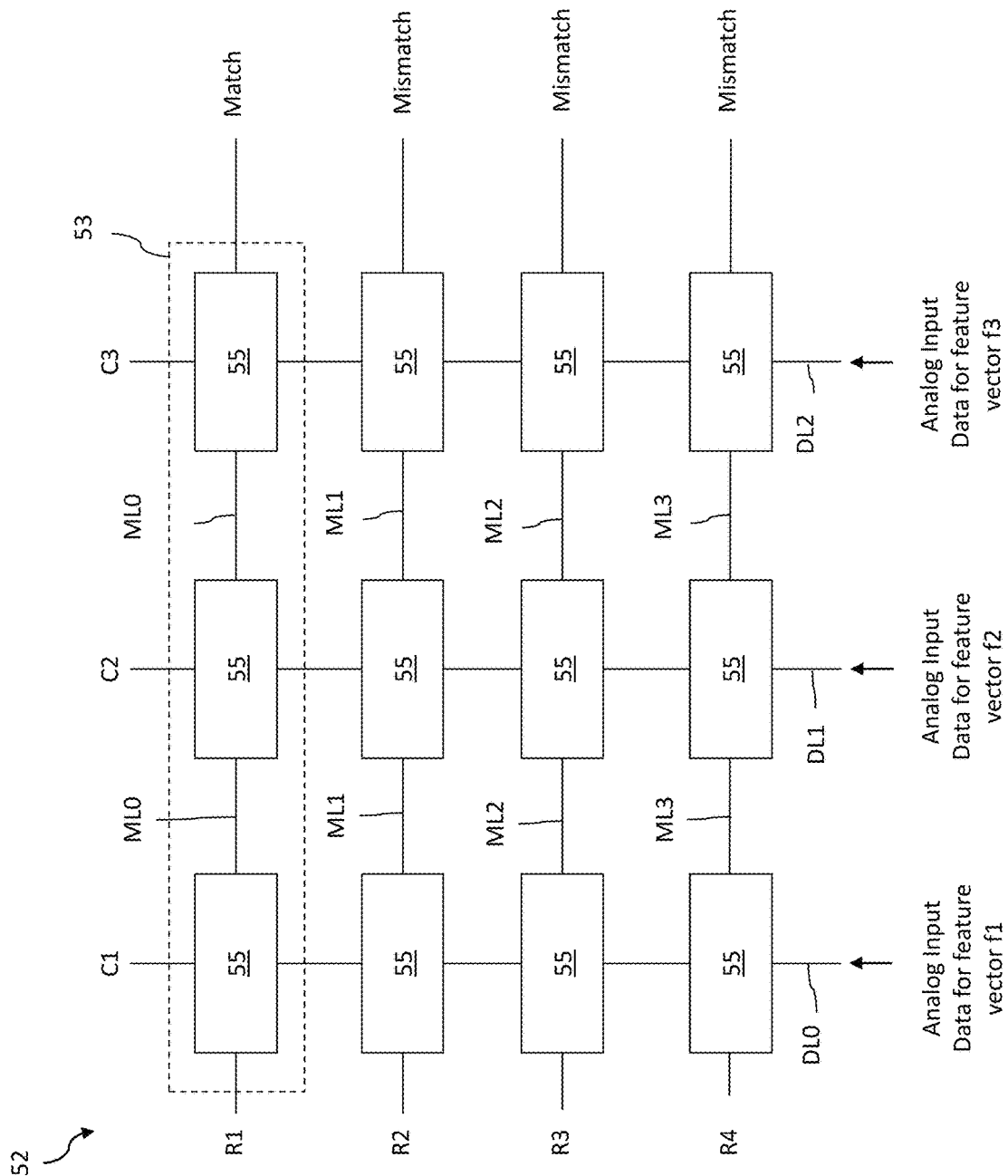
FIG. 2 illustrates a portion of an analog CAM array, according to some implementations.

In FIG. 2, a configuration for the analog CAM cells 55 within the analog CAM array 52 is shown. The analog CAM array 52 includes a plurality of analog CAM cells 55 arranged in rows (e.g., R1, R2, R3, etc.) and columns (e.g., C1, C2, C3, etc.). Each row of analog CAM cells 55 stores a word. During a search operation, a search word of analog input data is communicated to the analog CAM array 52 over data lines (e.g., DL0, DL1, DL2, etc.). Each row of analog CAM cells 55 then indicates whether the values of the analog input data are matched by the row's stored ranges of voltage values. The stored range of voltage values encoded in each analog CAM cell 55 is compared against a respective input data value of the search word. Each analog CAM cell 55 can match any value within its programmed variance range (where the range includes non-binary values). During a write operation, stored word of analog input data is communicated to a row of analog CAM cells 55 of the analog CAM array 52. The stored range of each analog CAM cell 55 is encoded based on a respective input data value of the stored word.

Referring back to FIG. 1, the search/write circuit 54 is adapted to perform a search operation, a write operation, or a compression operation for the analog CAM array 52. The search/write circuit 54 may comprise a digital to analog converter (DAC). The DAC is used to apply write voltages to analog CAM cells 55 of the analog CAM array 52 during a write operation, and to apply search voltages to analog CAM cells 55 of the analog CAM array 52 during a search operation. The search/write operations may involve setting the appropriate analog voltage levels to represent the desired data patterns. For example, the DAC may apply write voltages to program the range of voltages (e.g., the variance range) for each analog CAM cell 55, or may apply search voltages to test whether the search voltages are within the range of voltages (e.g., the variance range) programmed in each analog CAM cell 55.

The pre-charge circuit 56 is configured to pre-charge a match line of each analog CAM row 53 to a voltage $V_{ML}$ before a search operation begins, and is also configured to set a match line of each analog CAM row 53 to a constant voltage during a compression operation. During a search operation, the match line of an analog CAM row 53 remains high (e.g., remains at the voltage $V_{ML}$) to indicate a match if the row of input data applied to the analog CAM cells 55 of the analog CAM row 53 is matched by the stored ranges of voltage values in the respective analog CAM cells 55. Alternatively, the match line goes low (e.g., the voltage $V_{ML}$ drops) as a current in the match line discharges through pull-down transistors of an analog CAM cell 55 and into a discharge line of the analog CAM row 53 to indicate a mismatch if analog input data applied to the analog CAM cell 55 of the analog CAM row 53 is not matched by the stored range of voltage values in the analog CAM cell 55. During a compression operation, the match line of an analog CAM row 53 is held at a constant voltage, so as to induce a discharge current that may be measured to quantify a similarity of the analog CAM row 53 with a test word.

The sensing circuit 58 is adapted to sense the outputs of the analog CAM rows 53 of the analog CAM array 52. The sensing circuit 58 may comprise a sense amplifier for each analog CAM row 53. Additionally, the sensing circuit 58 may comprise a transimpedance amplifier (TIA) and an analog-to-digital converter (ADC) (subsequently described) for each analog CAM row 53. During a search operation, the discharge line of the analog CAM cells 55 of each analog CAM row 53 is connected to a reference voltage $V_{NS}$. The match line of the analog CAM cells 55 of each analog CAM row 53 is connected to a sense amplifier. The sense amplifier may be used during a search operation to detect if the match line of an analog CAM row 53 is high (indicating a match with a search word) or low (indicating a mismatch with the search word). As subsequently described in greater detail, the sensing circuit 58 is also used to test an analog CAM row 53 during a compression operation. During a compression operation, the discharge line of the analog CAM cells 55 of each analog CAM row 53 is connected to a TIA and a ADC. The TIA and ADC may be used during a compression operation to determine a similarity value of the analog CAM row 53 with a test word.

The mode selection circuit 60 is used to switch the analog CAM array 52 between different modes. For example, the mode selection circuit 60 may switch the analog CAM array 52 between a mode for performing search operation and a mode for performing a write operation. The mode selection circuit 60 may include a multiplexer for each analog CAM row 53. The multiplexers are used to rewire the connection of the analog CAM array 52 to the sensing circuit 58.

The controller 62 is adapted to control the mode selection circuit 60, the sensing circuit 58, and the search/write circuit 54. The controller 62 may include a digital control circuit such as a microcontroller, an application-specific integrated circuit, or the like. The digital control circuit provides the necessary control signals and data to the mode selection circuit 60, the sensing circuit 58, and the search/write circuit 54. For example, the digital control circuit may be used to drive the DAC of the search/write circuit 54, as well as control and coordinate the operation of the DAC. The controller 62 may include other components, such a clock circuit for temporalizing operations in the content addressable memory device 50.

Figure 3A:
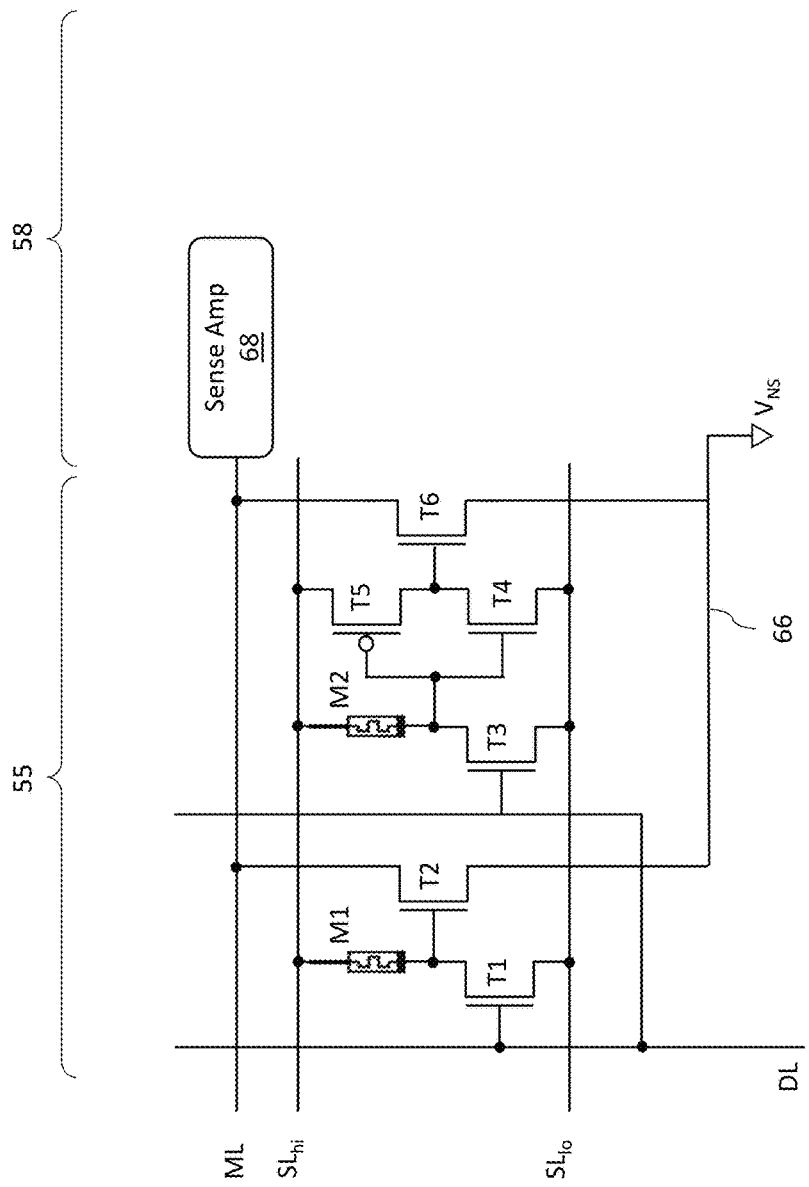
FIG. 3A illustrates an example of a circuit configuration for an analog CAM cell during a search operation, according to some implementations.

FIG. 3A illustrates an example of a circuit configuration 80 for an analog CAM cell 55 during a search operation. Specifically, one analog CAM cell 55 of a row is shown, along with the sense amplifier 68 for the sensing circuit 58 of that row. The circuit configuration 80 for the analog CAM cell 55 is shown as an example having a 6T2M circuit implementation. In other words, the circuit configuration 80 includes six transistors (e.g., T1-T6), and two memristors (e.g., the first memristor M1 and the second memristor M2). Further, the circuit configuration 80 includes a match line ML, a data line DL, a first source line $SL_{HI}$ and a second source line $SL_{LO}$. The first memristor M1 that is coupled in series with the transistor T1 can be considered as a memristor-transistor pair M1/T1. The second memristor M2 that is coupled in series with the transistor T3 can be considered as a memristor-transistor pair M2/T3. Memristors can function as non-volatile electronic memory devices, whose resistance can be programmed. Thus, analog values can be stored by (or encoded on) the analog CAM cells 55 using the conductance of the respective cell's memristors. The variance range (also referred to as a stored range, or width) of an analog CAM cell 55 is defined by a lower limit encoded by a conductance of the first memristor M1 and an upper limit encoded by a conductance of the second memristor M2.

During a write operation, programming voltages are applied to the first memristor M1 and the second memristor M2 of the analog CAM cell 55 to program the stored range of voltages (e.g., the variance range) for each analog CAM cell 55. This is done by applying a voltage to the first source line $SL_{HI}$, to increase the conductance of the first memristor M1 and/or the second memristor M2, and applying a voltage to the second source line $SL_{LO}$, to decrease the conductance of the first memristor M1 and/or the second memristor M2. A voltage may also be applied to the data line DL during the write operation. The search/write circuit 54 may be used to apply these voltages to the data line DL, the first source line $SL_{HI}$, and the second source line $SL_{LO}$.

During a search operation, a voltage is applied to the data line DL to provide the analog input data for comparison with the stored range of voltage values in the first memristor M1 and the second memristor M2. The search/write circuit 54 may be used to apply this voltage to the data line DL. The data line DL is electrically connected to a gate of the transistor T1 and to a gate of the transistor T3. Therefore, the circuit configuration 80 receives an input value via DL, which is used to set a target value relating to the searched input data. In operation, this desired search target value is input via DL, and the analog CAM cell 55 matches when the input target value is within the stored range of voltage values, defined via the conductances of the first memristor M1 and the second memristor M2. In the illustrated example, the transistors T1-T6 can be implemented as metal-oxide semiconductor field-effect transistors (MOSFETs), or the like.

Whether a match is found between the search input data received via the data line DL, and the data in the stored range of voltage values in the analog CAM cell 55, is indicated over the match line ML. The match line ML is pre-charged to a voltage $V_{ML}$ before a search operation begins (e.g., using the pre-charge circuit 56). As the search operation is performed, the match line ML remains high (e.g., remains at the voltage $VM_L$) to indicate a match if analog input data applied to the analog CAM cell 55 via the data line DL is matched by the stored range of voltage values that have been encoded in the analog CAM cell 55. Alternatively, if analog input data applied to the analog CAM cell 55 via the data line DL is not matched by the stored range of voltage values encoded in the analog CAM cell 55, the match line ML goes low (e.g., the voltage $VM_L$ drops) to indicate a mismatch. The voltage $V_{ML}$ drops because a current in the match line ML discharges through either of pull-down transistor T2 or pull-down transistor T6 of the analog CAM cell 55. For example, when a target search value of analog input data applied to the analog CAM cell 55 via the data line DL is lower than a lower limit of the variance range that is encoded by a conductance of the first memristor M1, the voltage $V_{ML}$ drops as the current in the match line ML discharges through the pull-down transistor T2, and into a discharge line 66. Further, when a target search value of analog input data applied to the analog CAM cell 55 via the data line DL is greater than an upper limit of the variance range that is encoded by a conductance of the second memristor M2, the voltage $VM_L$ drops as the current in the match line ML discharges through the pull-down transistor T6, and into the discharge line 66. The analog CAM cells 55 of each row are connected to a respective discharge line 66 that may be horizontally aligned with the analog CAM cells 55 it is connected to.

During a search operation, the match line ML is connected in series to a sense amplifier 68 of the sensing circuit. The sense amplifier 68 senses the voltage signal in the match line ML, and discriminates between a signal indicating a match (e.g., a high signal) and a signal indicating a mismatch (e.g., a low signal). In this way, the sensing circuit is used to determine if a given analog CAM cell 55 matched a value of a search word.

Referring back to FIG. 2, the analog CAM cells 55 of each analog CAM row 53 are connected to and share a respective match line. Therefore, the respective match line of each analog CAM row 53 will only indicate a match if all target search values of analog input data applied to respective analog CAM cells 55 of the analog CAM row 53 are matched by the stored range of voltage values that have been encoded in the respective analog CAM cells 55. If one or more target search values of analog input data applied to respective analog CAM cells 55 of the analog CAM row 53 are not matched by the stored range of voltage values that have been encoded in the respective analog CAM cells 55, a mismatch is indicated by the respective match line for the analog CAM row 53. The match line for an analog CAM row 53 is coupled to a sense amplifier 68 of the sensing circuit for that row.

The analog CAM array 52 may contain an implementation of a sparse look-up table (LUT), such as one that is created to be an analog representation of a machine learning model. The machine learning model can be based on a tree-based model, such as a decision tree model, a random forest model, gradient boosting model, an XGboost model, or the like.

A decision tree model is a machine learning algorithm that is typically used for classification and regression tasks. It has a tree-like structure where each internal node represents a decision based on a specific feature, and each leaf node represents a class label or a predicted value. The machine learning algorithm makes decisions by following a path from the root node to a leaf node based on the features of the input data.

A decision tree model can therefore be mapped to the analog CAM array 52, where the decision tree model suggests routing decisions, and these routing decisions are translated into rules to that can be stored in the analog CAM array 52. A decision tree model is typically composed of discrete branches with specific conditions at each node. These discrete conditions can be converted into an analog representation using the analog CAM array 52, where each analog CAM row 53 of the analog CAM array 52 may represent a different path or sequence of nodes in the decision tree. This would involve encoding the conditions and outcomes into the analog CAM cells 55 of each analog CAM row 53 along each of the different paths. For example, as described previously in FIG. 1 above, this encoding could involve applying programming voltages to the analog storage elements (e.g., the first memristor M1 and the second memristor M2) of each analog CAM cell 55 to program the range of voltages (e.g., the variance range) for each analog CAM cell 55. Furthermore, in the analog representation, each column (e.g., C1, C2, C3, etc.) may be an individual node in the decision tree. Each column could correspond to a respective feature vector (e.g., f1, f2, f3 . . . ) being evaluated at a node. The stored range of voltage values encoded in each analog CAM cell 55 of an analog CAM row 53 is compared against input data, and an output indicates whether a value of the input data is matched by the stored range of voltage values in that analog CAM row 53.

Referring further to FIG. 2, the example configuration shows that the analog CAM cells 55 of each column (e.g., C1, C2, C3, etc.) of the analog CAM array 52 are individually searchable over a respective data line (e.g., DL0, DL1, DL2, etc.). The data lines (e.g., DL0, DL1, DL2, etc.) each receive an analog value that is intended to be searched by the analog CAM array 52, which is conveyed via a respective voltage (e.g., $V_{DL0}$, $V_{DL1}$, $V_{DL2}$, etc.) that is applied on each of the data lines. As can be seen in FIG. 2, each data line may be vertically aligned to and coupled with a respective column of the analog CAM array 52. Whether a match is found between the data stored in each analog CAM cell 55 within a particular analog CAM row 53, and search input data received via a respective data line, is indicated over match lines (e.g., ML0, ML1, ML2, ML3, etc.).

As described previously, the analog CAM cells 55 of each analog CAM row 53 are connected to and share a respective match line (e.g., ML0, ML1, ML2, ML3, etc.) which is pre-charged to a voltage $V_{ML}$ before a search operation begins. The respective match line may be horizontally aligned with the analog CAM cells 55 it is connected to. As the search operation is performed, the respective match line remains high (e.g., remains at the voltage $V_{ML}$) to indicate a match if analog input data applied to each analog CAM cell 55 of the analog CAM row 53 is matched by the stored range of voltage values that have been encoded in the respective analog CAM cell 55. Alternatively, if analog input data applied to an analog CAM cell 55 of the analog CAM row 53 is not matched by the stored range of voltage values encoded in the respective analog CAM cell 55, the respective match line goes low (e.g., the voltage $V_{ML}$ drops) to indicate a mismatch, as a current in the match line discharges through pull-down transistors of the respective analog CAM cell 55.

When a decision tree model is stored in the analog CAM array 52, it is desirable to compress the analog CAM array 52 by eliminating similar rows of the analog CAM array 52. Due to non-linearities, a match line for a row of the analog CAM array 52 may not abruptly change between a high and low state, but rather may gradually change between a high and low state depending on how close the search values are to the upper/lower limits stored in the analog CAM cells 55. As a result of these non-linearities, rows of an analog CAM array 52 may be considered similar to each other (within a desired amount) even though the rows may not be identical. For example, two branches of the decision tree model may be similar enough that they may both be stored in the same row of an analog CAM array 52. The analog CAM array 52 may be compressed during a compression operation.

Figure 3B:
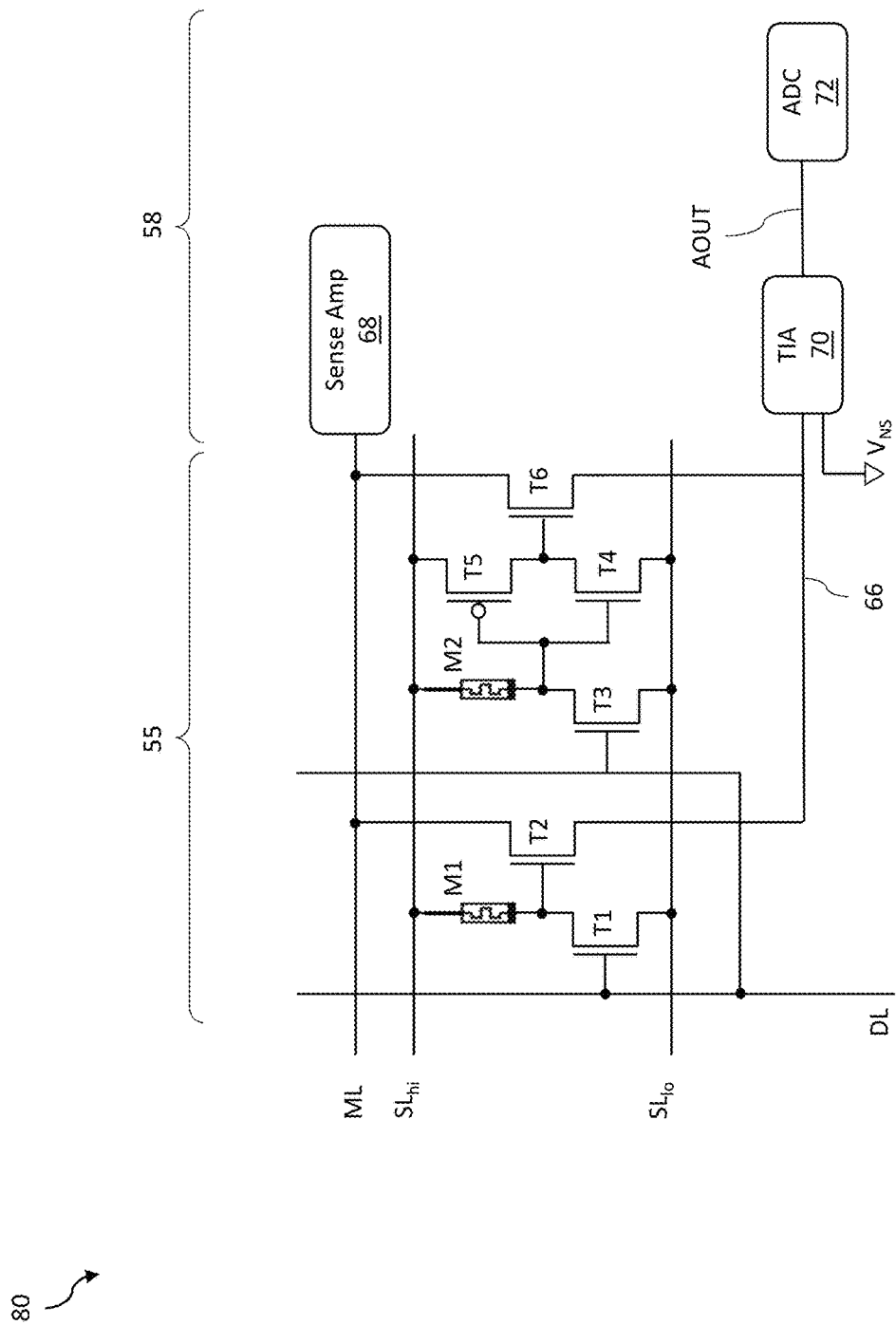
FIG. 3B illustrates an example of a circuit configuration for an analog CAM cell during a compression operation, according to some implementations.

FIG. 3B illustrates an example of a circuit configuration 80 for an analog CAM cell 55 during a compression operation. During the compression operation, the circuit configuration 80 is rewired so that a TIA 70 and an ADC 72 of the sensing circuit 58 are used to sense the discharge line 66. The circuit may be rewired through the use of the mode selection circuit 60 (see FIG. 1). For example, a multiplexer of the mode selection circuit may be connected to the discharge line 66, and used to select whether the discharge line 66 is coupled to the input of the TIA 70 (during a compression operation) or to the reference voltage $V_{NS}$ (during a search operation). Thus, the discharge line 66 is configured to be coupled to both the reference voltage $V_{NS}$ and the TIA 70, and may be switched between these during operation by the mode selection circuit 60.

Figure 4:
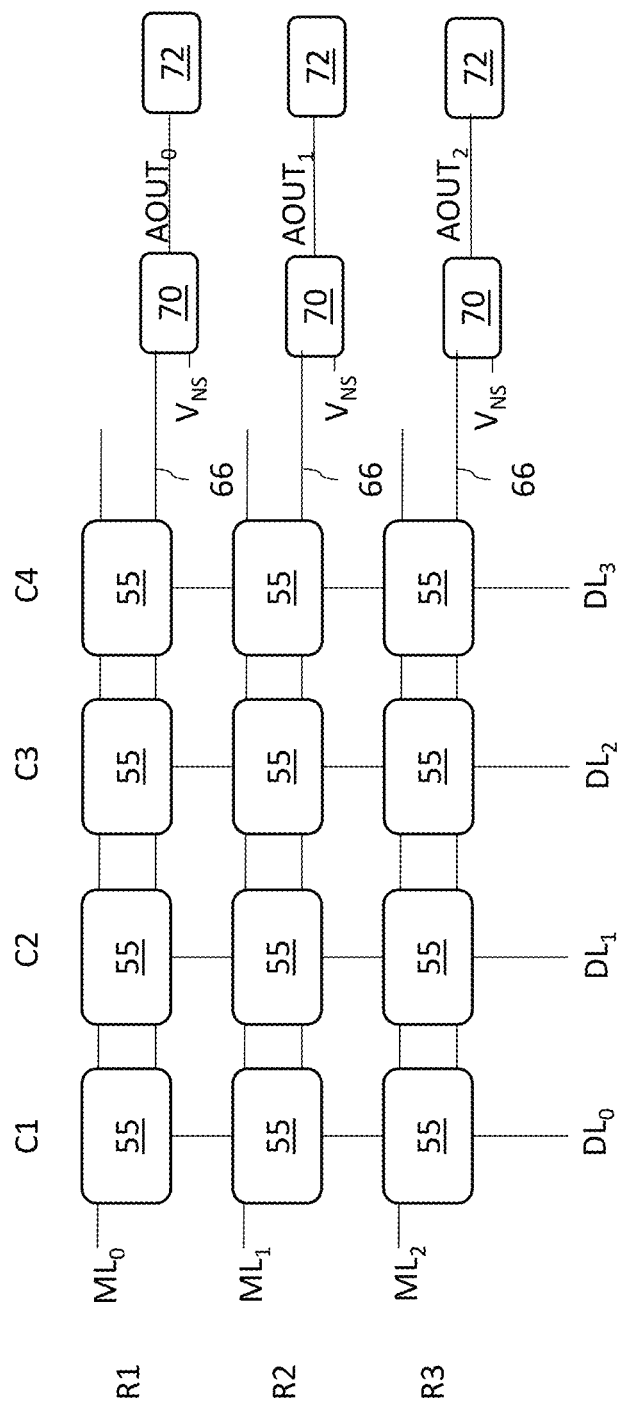
FIG. 4 illustrates a configuration for analog CAM cells during a compression operation, according to some implementations.

In FIG. 4, a configuration for the analog CAM cells 55 within the analog CAM array 52 during a compression operation is shown. All analog CAM cells 55 of each analog CAM row are connected to and share a respective discharge line 66. During a compression operation, the match line ML of an analog CAM row is held at a constant voltage (e.g., using the pre-charge circuit 56). As a result, a discharge current flows from the match line ML to a discharge line 66 of the analog CAM row, through the analog CAM cells 55 of the analog CAM row. The discharge currents that flows through respective discharge lines 66 of different analog CAM rows can be used as a basis to compare and determine how similar the analog CAM rows are to each other (e.g., via determining a measure of similarity). This is because, as a result of the previously mentioned non-linearities, the discharge current in each discharge line 66 is a collective measure of a mismatch between target search values of analog input data applied to respective analog CAM cells 55 of an analog CAM row and stored ranges of voltage values that have been encoded in the respective analog CAM cells 55 of the analog CAM row.

The analog voltage output of each analog CAM row generated by a TIA 70 can be sensed and converted to a digital representation by an ADC 72. The digital values generated by the ADCs 72 represent the analog voltage outputs ($AOUT_0$-$AOUT_2$) that originated from the respective discharge currents in the different discharge lines 66. Since each voltage output is proportional to the discharge current in a respective discharge line 66, the digital values generated by the ADCs 72 are also proportional to the discharge currents in the respective discharge lines 66. These digital representations can now be used as measures of similarity of an analog CAM row, which can be compared to one another to identify similar analog CAM rows of the analog CAM array 52.

Figure 5:
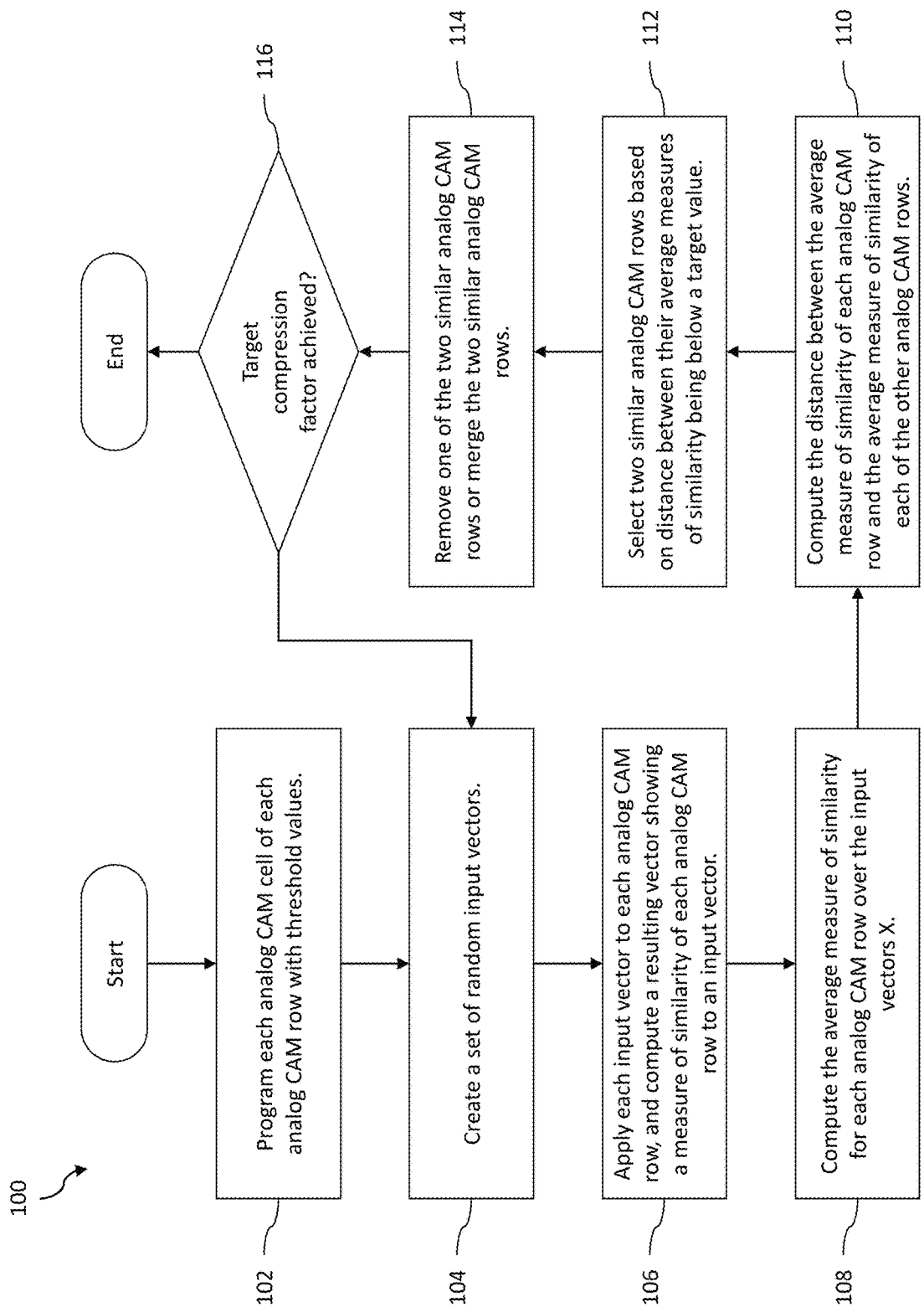
FIG. 5 illustrates a flowchart diagram for performing a compression method on an analog CAM array, according to some implementations.

In FIG. 5, a compression method 100 for the analog CAM array 52 (described previously in FIG. 1 to FIG. 4) is illustrated. The analog CAM array 52 may be used to implement a sparse look-up table (LUT) that is an analog representation of a machine learning model. The analog CAM array 52 includes a plurality of analog CAM cells 55 arranged in rows (e.g., R1, R2, R3, etc.) and columns (e.g., C1, C2, C3, etc.), and can also be represented as a matrix T with dimensions M×N, where M is the number of rows and N is the number of columns.

In step 102, voltages are programmed into the analog storage elements (e.g., the first memristor M1 and the second memristor M2) of each analog CAM cell 55 of the analog CAM array 52. This programming may involve setting the appropriate analog voltage levels using the digital-to analog-converter (DAC) of the search/write circuit 54 (described previously in FIG. 1) to program the range of voltages (e.g., the variance range) for each analog CAM cell 55. This is achieved by applying a higher voltage level to a first source line $SL_{HI}$ to define an upper limit or higher threshold ($T_{high}$) of the variance range, and by applying a lower voltage level to a second source line $SL_{LO}$ to define a lower limit or lower threshold ($T_{low}$) of the variance range.

In step 104, a set of random inputs is generated or simulated to create a plurality of input vectors X, each having a number of random elements N. The number of random elements N in each input vector $X_j$ may be equal to the number of columns in each analog CAM row 53 of the analog CAM array 52.

In step 106, each respective input vector $X_j$ of random inputs (generated in step 104) is applied to each analog CAM row 53, and a similarly vector is computed for the respective input vector $X_j$. Each element of the similarly vector is a measure of similarity of each analog CAM row 53 with the respective input vector $X_j$. As described previously in FIG. 3B and FIG. 4, the discharge currents that flow through respective discharge lines 66 of the different analog CAM rows 53 can be used as a basis to compare and determine how similar (e.g., by using a measure of similarity S) the analog CAM rows 53 are to each other. The discharge current in each discharge line 66 is a collective measure of a mismatch between target search values of the random inputs applied to respective analog CAM cells 55 of an analog CAM row 53, and stored ranges of voltage values that have been encoded in the respective analog CAM cells 55 of the analog CAM row 53. Each of the analog CAM cells 55 of an analog CAM row 53 contributes to the discharge current in the discharge line 66 of that row. Also as described previously in FIG. 3B and FIG. 4, the discharge current in the discharge line 66 of each analog CAM row 53 is converted to an analog voltage output (AOUT) by a TIA 70. This analog voltage output is then sensed and converted to a digital representation by an ADC 72. This digital representation can be used as a measure of similarity S of an analog CAM row 53, and is compared to measures of similarity S of other analog CAM rows 53. The measure of similarity $S_{ij}$ that is calculated for each row $T_i$ of the matrix T that represents the analog CAM array 52, for a input vector $X_j$, can therefore be expressed as:

$$S_{ij} = SIM(T_i, X_j) \qquad (1)$$

In step 108, an average (also referred to as mean) measure of similarity $S_{ave}$ for each analog CAM row 53 is then calculated from the measures of similarity S (determined in step 106) for the respective analog CAM row 53. This average measure of similarity $S_{ave}$ is calculated over the plurality of input vectors X. The average measure of similarity $S_{ave}$ can be expressed as:

$$S_{ave} = \frac{1}{N}\Sigma_i S_{ij} \qquad (2)$$

In step 110, a distance D is computed between the average measure of similarity $S_{ave}$ of each analog CAM row 53 and the average measure of similarity $S_{ave}$ of each of the other analog CAM rows 53 of the analog CAM array 52. The distance D is used to assess how similar or dissimilar each analog CAM row 53 is from each of the other analog CAM rows 53. For example, the distance D computed between an average measure of similarity $S_p$ of a first analog CAM row 53 and an average measure of similarity $S_q$ of a second analog CAM row 53 can be expressed as a magnitude of a difference between the average measure of similarity $S_p$ and the average measure of similarity $S_q$. The magnitude of the difference can indicate the amount of similarity between the first analog CAM row 53 and the second analog CAM row 53. During this step, an analog CAM row 53 is excluded from comparison with itself. The distance D computed between the average measure of similarity $S_p$ of the first analog CAM row 53 and the average measure of similarity $S_q$ of the second analog CAM row 53 can be expressed as:

$$D_{pq} = |S_p - S_q| \qquad (3)$$

In step 112, a selection is made of two similar analog CAM rows 53 of the analog CAM array 52 based on the distance D between their average measures of similarity $S_{ave}$ being below a target value. Two analog CAM rows 53 having such a distance D between their average measures of similarity $S_{ave}$ can be regarded as having a high degree of similarity. The target value is chosen to ensure that the two analog CAM rows 53 that are selected have average measures of similarity $S_{ave}$ that are close to each other (e.g. within a desired amount). For example a first analog CAM row 53 and a second analog CAM row 53 may be selected as being similar by using a selection argument in a calculation to ensure the distance D between their average measures of similarity $S_{ave}$ is below a minimum target value. The selection of two similar rows (e.g., a row i and a row k) of the analog CAM array 52 may be performed by computing the argument of the minimum (argmin) of each of the distances D, e.g., by the expression:

$$i, k = \mathrm{argmin}(D) \qquad (4)$$

In step 114, one of the two similar analog CAM rows 53 (selected in step 112) may be removed from the analog CAM array 52. This is further illustrated in FIG. 6A, in which two similar analog CAM rows 53 (e.g., a row k and a row i) of the analog CAM array 52 that were selected previously in step 112 are shown. In FIG. 6A, a conceptual depiction of a range of voltages (e.g., variance range) that can be programed into each analog CAM cell 55 of the row k and the row i is shown. The shaded portion of each analog CAM cell 55 of the row k and the row i represents its variance range (also referred to as a stored range, or width) which has an upper limit and a lower limit. A match is indicated for a target search value of analog input data applied to an analog CAM cell 55 of the row k or the row i if that target search value is matched by the stored range of voltage values (e.g., falls within the shaded portion) that have been encoded in that analog CAM cell 55.

As can be seen in FIG. 6A, the row i is removed from the analog CAM array 52 leaving only the row k. In other implementations, the row k is removed from the analog CAM array 52 leaving only the row i. In this way, any one analog CAM row 53 of the two similar analog CAM rows 53 can be removed, leaving the other remaining analog CAM row 53 operational and able to function without interruption. The selection of which row to remove may be performed randomly.

Figure 6B:
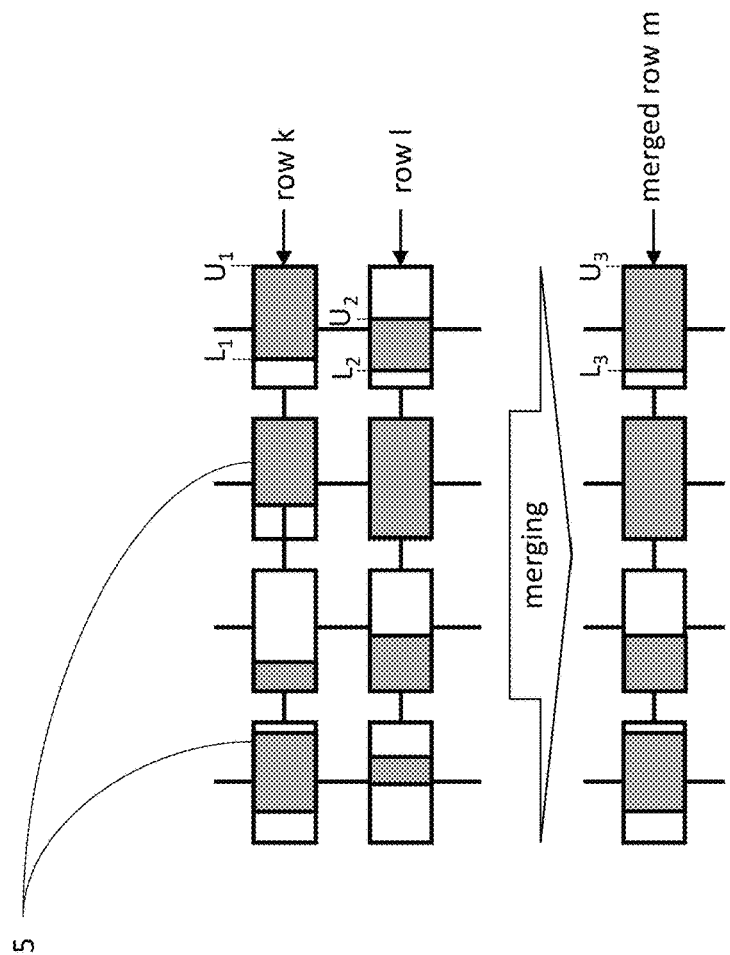
FIG. 6B is a conceptual diagram illustrating a step of the compression method shown in FIG. 5 for merging two rows of the analog CAM array, according to some implementations.
Figure 6A:
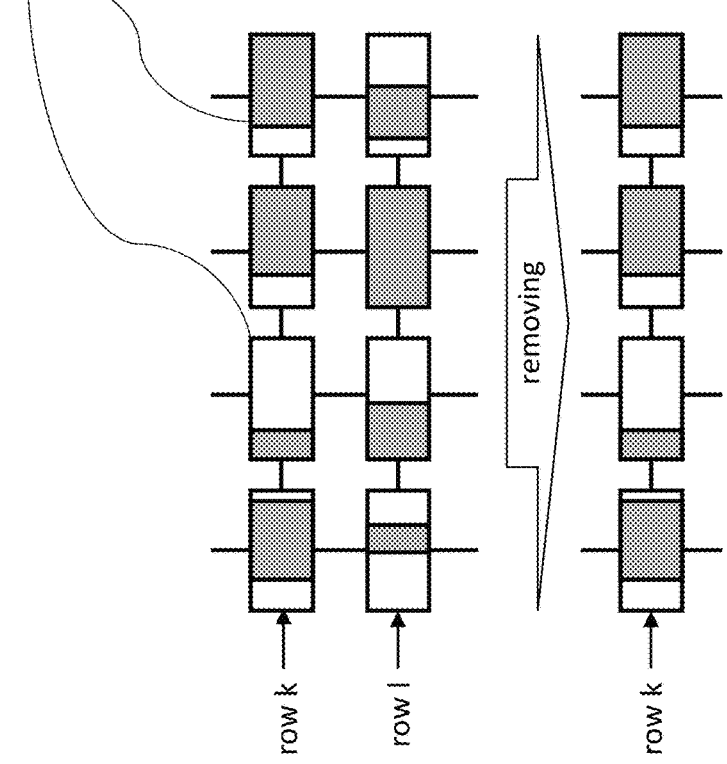
FIG. 6A is a conceptual diagram illustrating a step of the compression method shown in FIG. 5 for removing a row of the analog CAM array, according to some implementations.

FIG. 6B illustrates a step being performed in step 114 that is in accordance with some other implementations. The step performed in FIG. 6B differs from the step performed in FIG. 6A in that instead of removing one of the two similar analog CAM rows 53 that were selected previously in step 112 as described in FIG. 6A, the two similar analog CAM rows 53 are merged together as illustrated in FIG. 6B to form a new analog CAM row 53. In FIG. 6B, two similar analog CAM rows 53 (e.g., a row k and a row i) of the analog CAM array 52 that were selected previously in step 112 are shown. Further, in FIG. 6B, a conceptual depiction of a range of voltages (e.g., variance range) that can be programed into each analog CAM cell 55 of the row k and the row i is shown. The shaded portion of each analog CAM cell 55 of the row k and the row i represents this variance range (also referred to as a stored range, or width) which has an upper limit and a lower limit. A match is indicated for a target search value of analog input data applied to an analog CAM cell 55 of the row k or the row i if that target search value is matched by the stored range of voltage values (e.g., falls within the shaded portion) that have been encoded in that analog CAM cell 55.

As can be seen in FIG. 6B, the row k is merged with the row i to form a new row m. Specifically, each analog CAM cell 55 of the row k is merged with a respective analog CAM cell 55 of the row i to form a new variance range for an analog CAM cell 55 of the new row m, wherein the analog CAM cell 55 of the row k, the respective analog CAM cell 55 of the row i, and the new analog CAM cell 55 of the row m are in the same column of the analog CAM array 52. Each new analog CAM cell 55 of the row m may have a new range of voltages (e.g., new variance range) different from the range of voltages (e.g., variance range) of each of the respective analog CAM cells 55 of the row k and the row i that were merged to form the new analog CAM cell 55. Therefore, this new analog CAM cell 55 of the row m is shown having a different shaded portion to represent this new variance range. For example, a first analog CAM cell 55 of the row k may have a first variance range that has a first upper limit $U_1$ and a first lower limit $L_1$. A second analog CAM cell 55 of the row i may have a second variance range that has a second upper limit $U_2$ and a second lower limit $L_2$. The first analog CAM cell 55 is merged with the second analog CAM cell 55 to form a third analog CAM cell 55 of the new row m, the third analog CAM cell 55 having a third variance range that has a third upper limit Us and a third lower limit $L_3$. A voltage value of the third upper limit Us of the third analog CAM cell 55 is equal to a voltage value of whichever is greater between the upper limit $U_1$ of the first analog CAM cell 55, and the upper limit $U_2$ of the second analog cam cell 55. A voltage value of the third lower limit $L_3$ of the third analog CAM cell 55 is equal to a voltage value of whichever is smaller between the lower limit $L_1$ of the first analog CAM cell 55, and the lower limit $L_2$ of the second analog cam cell 55. After the merged row m is added to the analog CAM array 52, the row k and the row i may be removed from the analog CAM array 52.

After the removal of one of the two similar analog CAM rows 53 is performed as shown in FIG. 6A, or the merging of the two similar analog CAM rows 53 is performed as shown in FIG. 6B, the size of the analog CAM array 52 is evaluated as shown in step 116 to check if a desired compression factor ($\alpha$) has been achieved. The compression factor ($\alpha$) is expressed as a percentage (or its equivalent decimal form) by which the analog CAM array 52 is desired to be reduced in size. If the desired compression factor ($\alpha$) has been achieved, the compression method 100 ends. If the desired compression factor ($\alpha$) has not been achieved, the steps of the compression method 100 described previously in steps 104-116 are repeated until the desired compression factor ($\alpha$) has been achieved. For example, the analog CAM array 52 may have a first number (H) of analog CAM rows 53 before the compression method 100 is performed. The compression method 100 may then be performed to reduce the size (e.g., by reducing the first number of analog CAM rows H) by the desired compression factor ($\alpha$). The size of the analog CAM array 52 after the compression method 100 is performed, and the desired compression factor ($\alpha$) is achieved, can be expressed as:

$$(1-\alpha)H \quad (5)$$

Figure 7:
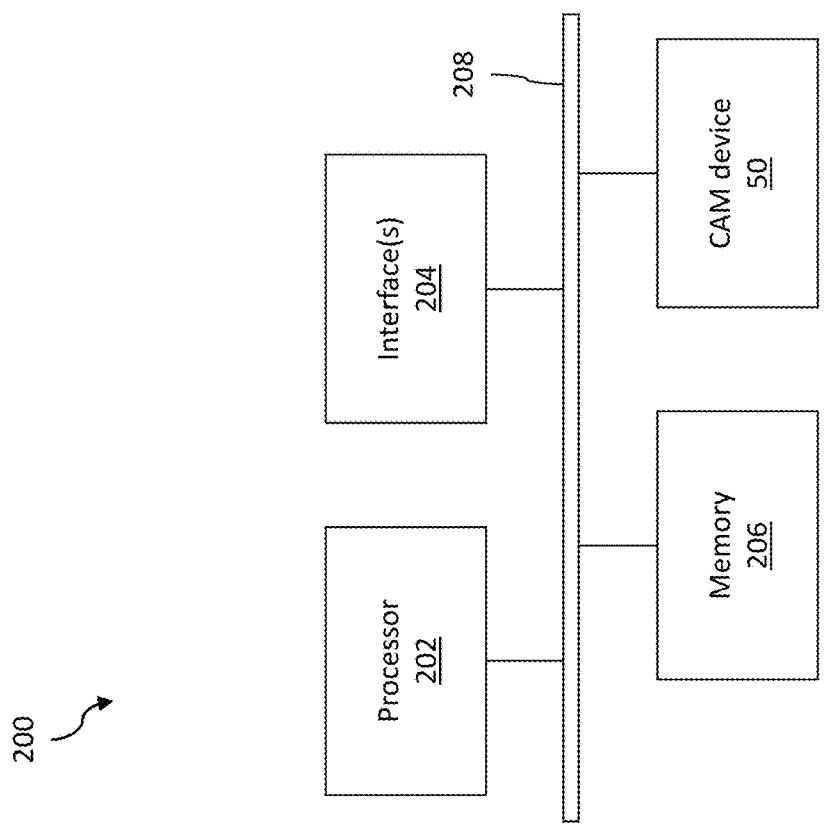
FIG. 7 is a block diagram of a computing system, according to some implementations.

FIG. 7 is a block diagram of a computing system 200, according to some implementations. The computing system 200 is used to operate a machine learning model, such as a decision tree model. The computing system 200 may be implemented in an electronic device. Examples of electronic devices include servers, desktop computers, laptop computers, mobile devices, gaming systems, and the like. The computing system 200 includes may include a processor 202, one or more interface(s) 204, a memory 206, and the content addressable memory device 50 (previously described in FIG. 1 to FIG. 4). The hardware components may be interconnected through a number of busses and/or network connections. In one example, the processor 202, the interface(s) 204, the memory 206, and the content addressable memory device 50 may be communicatively coupled via a bus 208.

The processor 202 retrieves executable code from the memory 206 and executes the executable code. The executable code may, when executed by the processor 202, cause the processor 202 to implement any functionality described herein. The processor 202 may be a microprocessor, an application-specific integrated circuit, a microcontroller, or the like. The processor 202 may interact with and control the content addressable memory device 50.

The interface(s) 204 enable the processor 202 to interface with various other hardware elements, external and internal to the computing system 200. For example, the interface(s) 204 may include interface(s) to input/output devices, such as, for example, a display device, a mouse, a keyboard, etc. Additionally or alternatively, the interface(s) 204 may include interface(s) to an external storage device, or to a number of network devices, such as servers, switches, and routers, client devices, other types of computing devices, and combinations thereof.

The memory 206 may include various types of memory modules, including volatile and nonvolatile memory. For example, the memory 206 may include Random Access Memory (RAM), Read Only Memory (ROM), a Hard Disk Drive (HDD), or the like. The memory 206 may include a non-transitory computer readable medium that stores instructions for execution by the processor 202. One or more modules within the computing system 200 may be partially or wholly embodied as software and/or hardware for performing any functionality described herein. Different types of memory may be used for different data storage needs. For example, in certain examples the processor 202 may boot from ROM, maintain nonvolatile storage in an HDD, and execute program code stored in RAM.

The compression method 100 may be implemented as software stored in the memory 206. Some steps of the compression method 100 may be performed in software, by the processor 202. Other steps of the compression method 100 may be performed in hard, by the content addressable memory device 50 (under control of the processor 202). In some implementations, steps 102, 106, and 114 of the compression method 100 are performing in hardware, while steps 104, 108, 110, 112, and 116 are performing in software. Other appropriate combinations of software/hardware processing may be utilized.

Advantages can be achieved as a result of performing the compression method 100 that includes generating a set of random inputs to create input vectors X each having a number of random elements N, and applying each random input vector X to each analog CAM row 53 of the analog CAM array 52 to compute a resulting vector showing a measure of similarity S for each respective analog CAM row 53 with the random input vector X. A measure of similarity S of each analog CAM row 53 is calculated by sensing discharge currents that flow through respective discharge lines 66 of the respective analog CAM rows 53, and converting each discharge current measured to an analog voltage output using a TIA 70. This analog voltage output is then sensed and converted to a digital representation by an ADC 72. This digital representation is then used as the measure of similarity S for the respective analog CAM row 53. An average measure of similarity $S_{ave}$ for each analog CAM row 53 is then calculated over the input vectors X, and a distance D is computed between the average measure of similarity $S_{ave}$ of each analog CAM row 53 and the average measure of similarity $S_{ave}$ of each of the other analog CAM rows 53 of the analog CAM array 52. The distance D between a first analog CAM row 53 and a second analog CAM row 53 can be expressed as a magnitude of a difference between the average measure of similarity $S_{ave}$ of the first analog CAM row 53 and the average measure of similarity $S_{ave}$ of the second analog CAM row 53. A selection is then made of two similar analog CAM rows 53 of the analog CAM array 52 based on the distance D between their average measures of similarity $S_{ave}$ being below a minimum target value. After the selection of the two similar analog CAM rows 53, one of the two similar analog CAM rows 53 may be eliminated from the analog CAM array 52, such as by removing it from the analog CAM array 52 or by merging the two similar analog CAM rows 53 to form a new analog CAM row 53, thereby reducing the total number of analog CAM rows 53 of the analog CAM array 52 (e.g., reducing the size of the analog CAM array 52). The steps of the compression method 100 described above may be repeated until a desired reduction in size (e.g., by the compression factor ($\alpha$)) of the analog CAM array 52 is achieved. These advantages include allowing for the size of the analog CAM array 52 to be reduced by up to 15 percent without an appreciable loss in model accuracy (e.g., the accuracy of a machine learning model stored in the analog CAM array 52). This allows for a reduction in the number of analog CAM rows 53 that need to be programmed during manufacturing, which results in time savings. In addition, as a result of the smaller size of the analog CAM array 52, a reduction in occupation area or memory size can be achieved. This results in lower power consumption since smaller memory arrays require fewer active components and consume less energy during search and write operations. Further, the use of the compression method 100 allows a larger machine learning model to be converted into an analog representation using the analog CAM array 52, since the machine learning model is not limited to only a size that the physical array (e.g., the analog CAM array 52) can encode.

Figure 8:
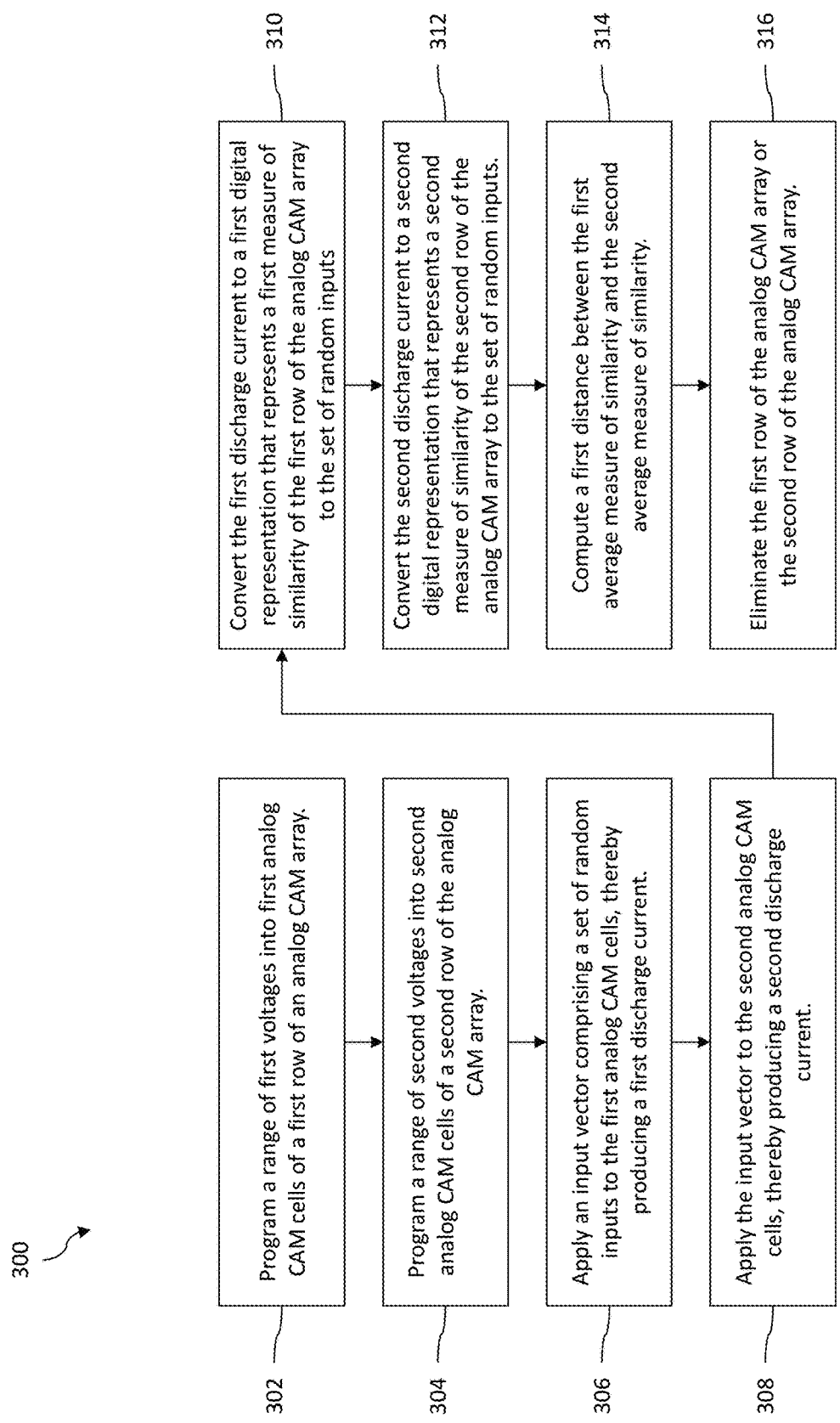
FIG. 8 illustrates a flowchart diagram for performing a compression method on an analog CAM array, according to some implementations.

FIG. 8 illustrates a flowchart diagram for performing a compression method 300 on an analog CAM array, according to some implementations. The compression method 300 may be performed in addition to or in lieu of the compression method 100 (previously described).

In step 302, a range of first voltages is programmed into first analog CAM cells of a first row of an analog CAM array.

In step 304, a range of second voltages is programmed into second analog CAM cells of a second row of the analog CAM array.

In step 306, an input vector comprising a set of random inputs is applied to the first analog CAM cells. Each of the first analog CAM cells is configured to contribute to a first discharge current on a first discharge line that is coupled to the first analog CAM cells based on whether a respective random input applied to a respective first analog CAM cell is within the range of the first voltages of the respective first analog CAM cell. The set of random inputs may be simulated, with a number of random inputs of the set of random inputs being equal to a number of columns of the analog CAM array. The input vector may be one of a plurality of input vectors applied to the first analog CAM cells and to the second analog CAM cells. When the input vector is one of a plurality of input vectors, a first average measure of similarity of the first row of the analog CAM array may be determined by calculating an average of the first measure of similarity over the input vectors.

In step 308, the input vector is applied to the second analog CAM cells. Each of the second analog CAM cells is configured to contribute to a second discharge current on a second discharge line that is coupled to the second analog CAM cells based on whether a respective random input applied to a respective second analog CAM cell is within the range of the second voltages of the respective second analog CAM cell. When the input vector is one of a plurality of input vectors, a second average measure of similarity of the second row of the analog CAM array may be determined by calculating an average of the second measure of similarity over the input vectors.

In step 310, the first discharge current is converted to a first digital representation that represents a first measure of similarity of the first row of the analog CAM array to the set of random inputs.

In step 312, the second discharge current is converted to a second digital representation that represents a second measure of similarity of the second row of the analog CAM array to the set of random inputs.

In step 314, a first distance between the first average measure of similarity and the second average measure of similarity is computed. The first distance is equal to the magnitude of a difference between the first average measure of similarity and the second average measure of similarity.

In step 316, the first row of the analog CAM array or the second row of the analog CAM array are eliminated. The first row of the analog CAM array or the second row of the analog CAM array may be removed based on whether the first distance is below a minimum target value. Alternatively, the first row of the analog CAM array and the second row of the analog CAM array may be merged into a single row of the analog CAM array based on whether the first distance is below a minimum target value.

As used herein, a circuit might be implemented utilizing any form of hardware, software, or a combination thereof. For example, one or more processors, controllers, ASICS, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain implementations include, while other implementations do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

The foregoing outlines features of several examples so that those skilled in the art may better understand the aspects of the present disclosure. Various modifications and combinations of the illustrative examples, as well as other examples, will be apparent to persons skilled in the art upon reference to the description. It is therefore intended that the appended claims encompass any such modifications.

What is claimed is:

1. A content addressable memory (CAM) device comprising:
   an analog CAM array, a first row of the analog CAM array comprising:
      first analog CAM cells, each of the first analog CAM cells storing data that is associated with a respective first stored range of analog values having a first lower limit and a first upper limit; and
      a first match line horizontally aligned with and coupled to the first analog CAM cells; and
      a first discharge line horizontally aligned with and coupled to the first analog CAM cells, wherein each of the first analog CAM cells is configured to contribute to a first discharge current on the first discharge line based on whether a respective search value is within the respective first stored range of analog values;
   a first transimpedance amplifier configured to be coupled to the first discharge line, the first transimpedance amplifier configured to convert the first discharge current into a first analog output; and
   a first analog-to-digital converter coupled to the first transimpedance amplifier, the first analog-to-digital converter configured to convert the first analog output to a first digital output.

2. The CAM device of claim 1, wherein a second row of the analog CAM array comprises:
   second analog CAM cells; and
   a second discharge line horizontally aligned with and coupled to the second analog CAM cells.

3. The CAM device of claim 2, wherein the first discharge line is different from the second discharge line.

4. The CAM device of claim 2, wherein each of the second analog CAM cells store data that is associated with a respective second stored range of analog values having a second lower limit and a second upper limit, and wherein each of the second analog CAM cells is configured to contribute to a second discharge current on the second discharge line based on whether a respective search value is within the respective second stored range of analog values.

5. The CAM device of claim 4, wherein the second row of the analog CAM array further comprises:
   a second transimpedance amplifier configured to be coupled to the second discharge line, the second transimpedance amplifier configured to convert the second discharge current into a second analog output; and
   a second analog-to-digital converter coupled to the second transimpedance amplifier, the second analog-to-digital converter configured to convert the second analog output to a second digital output.

6. The CAM device of claim 1, wherein each of the first analog CAM cells comprises:
   a first pull-down transistor coupled between the first match line and the first discharge line; and
   a second pull-down transistor coupled between the first match line and the first discharge line.

7. The CAM device of claim 1, further comprising:
   a mode selection circuit coupled to the analog CAM array.

8. A content addressable memory (CAM) device comprising:
   an analog CAM array, a first row of the analog CAM array comprising:
      a first analog CAM cell, the first analog CAM cell comprising:
         a first memristor storing a first analog value; and
         a second memristor storing a second analog value;
      a first match line coupled to the first analog CAM cell; and
      a first discharge line coupled to the first analog CAM cell, wherein the first analog CAM cell is configured to contribute to a first discharge current on the first discharge line based on whether a search value is between the first analog value and the second analog value; and
   a sensing circuit comprising:
      a first transimpedance amplifier configured to be coupled to the first discharge line, the first transimpedance amplifier configured to convert the first discharge current into a first analog output; and
      a first analog-to-digital converter coupled to the first transimpedance amplifier, wherein the first analog-to-digital converter is configured to generate a first digital representation of the first analog output.

9. The CAM device of claim 8, wherein the first row of the analog CAM array further comprises:
   a second analog CAM cell, the second analog CAM cell comprising:
      a third memristor storing a third analog value; and
      a fourth memristor storing a fourth analog value;
   wherein the first match line is coupled to the second analog CAM cell, the first discharge line is coupled to the second analog CAM cell, and the second analog CAM cell is configured to contribute to the first discharge current on the first discharge line based on whether a search value is between the third analog value and the fourth analog value.

10. The CAM device of claim 8, wherein the first analog CAM cell further comprises:
    a first pull-down transistor coupled between the first match line and the first discharge line; and
    a second pull-down transistor coupled between the first match line and the first discharge line.

11. The CAM device of claim 8, wherein a second row of the analog CAM array comprises:

a third analog CAM cell, the third analog CAM cell comprising:
  a fifth memristor storing a fifth analog value; and
  a sixth memristor storing a sixth analog value;
a second match line coupled to the third analog CAM cell; and
a second discharge line coupled to the third analog CAM cell, wherein the third analog CAM cell is configured to contribute to a second discharge current on the second discharge line based on whether a search value is between the fifth analog value and the sixth analog value.

12. The CAM device of claim 11, further comprising a first data line that is vertically aligned and coupled to the first analog CAM cell and the third analog CAM cell, the first data line configured to receive an applied voltage that is associated with input data for searching the first analog CAM cell and the third analog CAM cell.

13. The CAM device of claim 11, wherein the sensing circuit further comprises:
  a second transimpedance amplifier configured to be coupled to the second discharge line, the second transimpedance amplifier configured to convert the second discharge current into a second analog output; and
  a second analog-to-digital converter coupled to the second transimpedance amplifier, wherein the second analog-to-digital converter is configured to generate a second digital representation of the second analog output.

14. The CAM device of claim 8, wherein the first transimpedance amplifier is also configured to be coupled to the first match line.

15. A content addressable memory (CAM) compression method comprising:
  programming a range of first voltages into first analog CAM cells of a first row of an analog CAM array;
  programming a range of second voltages into second analog CAM cells of a second row of the analog CAM array;
  applying an input vector comprising a set of random inputs to the first analog CAM cells, wherein each of the first analog CAM cells is configured to contribute to a first discharge current on a first discharge line that is coupled to the first analog CAM cells based on whether a respective random input applied to a respective first analog CAM cell is within the range of the first voltages of the respective first analog CAM cell;
  applying the input vector to the second analog CAM cells, wherein each of the second analog CAM cells is configured to contribute to a second discharge current on a second discharge line that is coupled to the second analog CAM cells based on whether a respective random input applied to a respective second analog CAM cell is within the range of the second voltages of the respective second analog CAM cell;
  converting the first discharge current to a first digital representation that represents a first measure of similarity of the first row of the analog CAM array to the set of random inputs; and
  converting the second discharge current to a second digital representation that represents a second measure of similarity of the second row of the analog CAM array to the set of random inputs.

16. The CAM compression method of claim 15, wherein the input vector is one of a plurality of input vectors applied to the first analog CAM cells and to the second analog CAM cells, the CAM compression method comprising:
  determining a first average measure of similarity of the first row of the analog CAM array by calculating an average of the first measure of similarity over the input vectors; and
  determining a second average measure of similarity of the second row of the analog CAM array by calculating an average of the second measure of similarity over the input vectors.

17. The CAM compression method of claim 16, further comprising:
  computing a first distance between the first average measure of similarity and the second average measure of similarity, wherein the first distance is equal to the magnitude of a difference between the first average measure of similarity and the second average measure of similarity.

18. The CAM compression method of claim 17, further comprising:
  removing the first row of the analog CAM array or the second row of the analog CAM array based on whether the first distance is below a minimum target value.

19. The CAM compression method of claim 17, further comprising:
  merging the first row of the analog CAM array and the second row of the analog CAM array into a single row of the analog CAM array based on whether the first distance is below a minimum target value.

20. The CAM compression method of claim 15, further comprising:
  simulating the set of random inputs, a number of random inputs of the set of random inputs being equal to a number of columns of the analog CAM array.

* * * * *